US010262596B2

(12) United States Patent
Sano et al.

(10) Patent No.: US 10,262,596 B2
(45) Date of Patent: Apr. 16, 2019

(54) PIXEL CIRCUIT

(71) Applicant: FORDLEY Hong Kong Limited, Hong Kong (HK)

(72) Inventors: Keiichi Sano, Hong Kong (HK); Ryuji Nishikawa, Hong Kong (HK)

(73) Assignee: AOT LIMITED, Shenzhen (CN)

( * ) Notice: Subject to any disclaimer, the term of this patent is extended or adjusted under 35 U.S.C. 154(b) by 4 days.

(21) Appl. No.: 15/697,861

(22) Filed: Sep. 7, 2017

(65) Prior Publication Data

US 2018/0068619 A1 Mar. 8, 2018

(30) Foreign Application Priority Data

Sep. 8, 2016 (CN) .......................... 2016 1 0812543

(51) Int. Cl.

*H01L 51/52* (2006.01)
*G09G 3/3233* (2016.01)
*G09G 3/3258* (2016.01)

(52) U.S. Cl.

CPC ......... *G09G 3/3258* (2013.01); *G09G 3/3233* (2013.01); *H01L 51/5203* (2013.01); *G09G 2300/043* (2013.01); *G09G 2300/0814* (2013.01); *G09G 2300/0819* (2013.01); *G09G 2300/0852* (2013.01); *G09G 2300/0861* (2013.01); *G09G 2310/0243* (2013.01); *G09G 2310/0264* (2013.01); *G09G 2310/08* (2013.01)

(58) Field of Classification Search

CPC .................................................. H01L 51/5203
See application file for complete search history.

(56) References Cited

U.S. PATENT DOCUMENTS

2006/0187153 A1* 8/2006 Nathan ................ G09G 3/3233 345/76

* cited by examiner

*Primary Examiner* — William A Harriston
(74) *Attorney, Agent, or Firm* — Birch, Stewart, Kolasch & Birch, LLP

(57) ABSTRACT

A pixel circuit includes a selection transistor, a driving transistor, an emissive element, a first capacitor, a reference transistor and a second capacitor. The selection transistor is coupled to a gate line and a data line. A control electrode of the driving transistor is coupled to the selection transistor and a first electrode of the driving transistor is coupled to a power source line. The emissive element emits light according to a current drawn from the driving transistor. The first capacitor is coupled to the driving transistor and an emission signal line. A control electrode of the reference transistor is coupled to a first voltage source. A second electrode of the reference transistor is coupled to the control electrode of the driving transistor. The second capacitor is coupled to a second voltage source and the reference transistor.

20 Claims, 8 Drawing Sheets

200

PIXEL CIRCUIT

CROSS REFERENCE TO RELATED APPLICATIONS

This Application claims priority of China Patent Application No. 201610812543.2, filed on 2016 Sep. 8 the entirety of which is incorporated by reference herein.

BACKGROUND OF THE INVENTION

Field of the Invention

The invention relates to a pixel circuit in a display device, and more particularly to a pixel circuit that can compensate for the threshold voltage variation to reduce current non-uniformities.

Description of the Related Art

With the rapid developments being made in display technologies, display devices with touch functionality are becoming more and more popular because of their advantages such as visualization. Based on the position of the touch panel relative to the display panel, existing display devices can generally be divided into two groups, i.e. on-cell touch panels and in-cell touch panels. Compared to an on-cell touch panel, an in-cell touch panel is thinner and has a higher light transmittance, and therefore it has a wider range of applications. As for current display devices, as a current light-emitting device, the organic light-emitting diode (OLED) is increasingly being used in the field of high-performance displays, as it has characteristics such as self-illumination, fast response, wide viewing angle, and it can be produced on a flexible substrate. OLED display devices can be divided into PMOLED (Passive Matrix driving OLED) and AMOLED (Active Matrix driving OLED) according to the driving mode. The AMOLED display device is expected to replace the LCD (Liquid-Crystal Display) as the next generation of new flat panel displays, thanks to their low manufacturing cost, high response speed, low power consumption, being DC driving for portable devices, large operating temperature range, and so on. Therefore, AMOLED display panels are becoming more and more popular.

In the current AMOLED display panel, each OLED is driven to emit light by the driving circuit formed by a plurality of TFTs (Thin Film Transistors) within the same pixel unit as the OLED located on the array substrate, so as to implement display. However, variation in the threshold voltage among the driving TFTs results in a non-uniform image on the display. It is difficult to obtain uniform properties of the TFTs on the whole display area.

Therefore, it is desirable to provide a novel pixel circuit to suppress the effects of variation in the threshold voltage among the driving TFTs without adding too many elements to the pixel circuit.

BRIEF SUMMARY OF THE INVENTION

Pixel circuits are provided. An exemplary embodiment of a pixel circuit comprises a selection transistor, a driving transistor, an emissive element, a first capacitor, a reference transistor and a second capacitor. The selection transistor comprises a control electrode, a first electrode and a second electrode. The control electrode is coupled to a gate line for receiving a selection signal. The first electrode is coupled to a data line. The driving transistor comprises a control electrode, a first electrode and a second electrode. The control electrode is coupled to the second electrode of the selection transistor. The first electrode is coupled to a power source line. The emissive element is coupled to the second electrode of the driving transistor and emits light according to a current drawn from the driving transistor. The first capacitor comprises a first terminal coupled to the control electrode of the driving transistor and a second terminal coupled to an emission signal line. The reference transistor comprises a control electrode coupled to a first voltage source providing a voltage with a first predetermined level, a first electrode and a second electrode. The second electrode of the reference transistor is coupled to the control electrode of the driving transistor. The second capacitor comprises a first terminal coupled to a second voltage source providing a voltage with a second predetermined level and a second terminal coupled to the first electrode of the reference transistor.

Another exemplary embodiment of a pixel circuit comprises a pair of pixel units comprising a first pixel unit and a second pixel unit, a reference transistor, a first capacitor and a second capacitor. The first pixel unit comprises a first selection transistor, a first driving transistor and a first emissive element. The first selection transistor comprises a control electrode, a first electrode and a second electrode. The control electrode is coupled to a first gate line for receiving a first selection signal. The first electrode is coupled to a data line. The first driving transistor comprises a control electrode, a first electrode and a second electrode. The control electrode is coupled to the second electrode of the first selection transistor. The first electrode is coupled to a power source line. The first emissive element is coupled to the second electrode of the first driving transistor and emits light according to a current drawn from the first driving transistor. The second pixel unit comprises a second selection transistor, a second driving transistor and a second emissive element. The second selection transistor comprises a control electrode, a first electrode and a second electrode. The control electrode is coupled to a second gate line for receiving a second selection signal. The first electrode is coupled to the data line. The second driving transistor comprises a control electrode, a first electrode and a second electrode. The control electrode is coupled to the second electrode of the second selection transistor. The first electrode is coupled to the power source line. The second emissive element is coupled to the second electrode of the second driving transistor and emits light according to a current drawn from the second driving transistor. The reference transistor comprises a control electrode coupled to a voltage source providing voltage at a predetermined level, a first electrode coupled to the control electrode of the first driving transistor and a second electrode coupled to the control electrode of the second driving transistor. The first capacitor comprises a first terminal coupled to the control electrode of the first driving transistor and a second terminal coupled to a first emission signal line. The second capacitor comprises a first terminal coupled to the control electrode of the second driving transistor and a second terminal coupled to a second emission signal line.

Another exemplary embodiment of a pixel circuit comprises a pair of pixel units comprising a first pixel unit and a second pixel unit, a selection transistor, a reference transistor, a first capacitor and a second capacitor. The first pixel unit comprises a first driving transistor and a first emissive element. The first driving transistor comprises a control electrode, a first electrode coupled to a first power source line and a second electrode. The first emissive element is coupled to the second electrode of the first driving transistor and emits light according to a current drawn from the first driving transistor. The second pixel unit comprises a second driving transistor and a second emissive element. The second driving transistor comprises a control electrode, a first electrode coupled to a second power source line and a second electrode. The second emissive element is coupled to the second electrode of the second driving transistor and emits light according to a current drawn from the second driving transistor. The selection transistor comprises a control electrode coupled to a gate line for receiving a selection signal, a first electrode coupled to a data line and a second electrode coupled to the control electrode of the first driving transistor and the control electrode of the second driving transistor. The reference transistor comprises a control electrode coupled to a voltage source providing voltage at a predetermined level, a first electrode coupled to the control electrode of the first driving transistor and a second electrode coupled to the control electrode of the second driving transistor. The first capacitor comprises a first terminal coupled to the control electrode of the first driving transistor and a second terminal coupled to a first emission signal line. The second capacitor comprises a first terminal coupled to the control electrode of the second driving transistor and a second terminal coupled to a second emission signal line.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
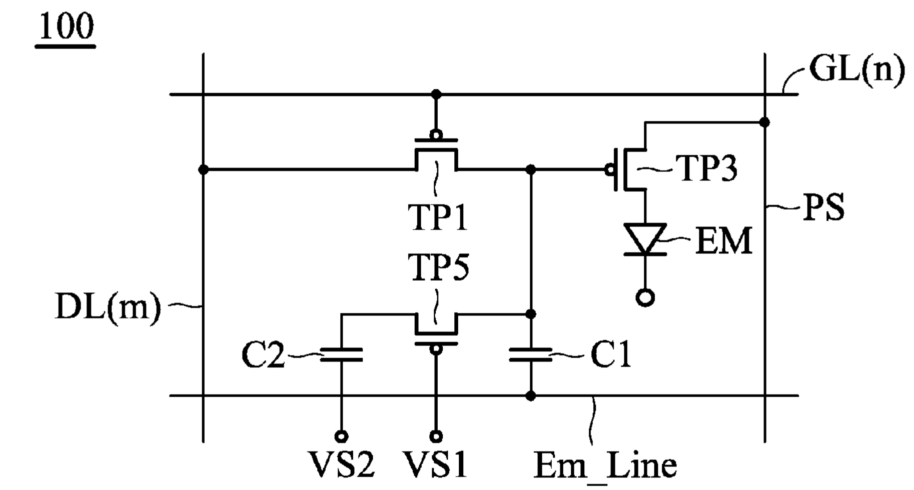
FIG. 1 is an exemplary circuit diagram of a pixel circuit according to a first embodiment of the invention.

FIG. 1 is an exemplary circuit diagram of a pixel circuit according to a first embodiment of the invention. The pixel circuit 100 may comprise a selection transistor TP1, a driving transistor TP3, a reference transistor TP5, an emissive element EM, and capacitors C1 and C2. In the first embodiment of the invention, the selection transistor TP1, the driving transistor TP3 and the reference transistor TP5 are P-type transistors.

The selection transistor TP1 may comprise a control electrode coupled to a gate line GL(n) for receiving a selection signal therefrom, a first electrode coupled to a data line DL(m) and a second electrode. The driving transistor TP3 may comprise a control electrode coupled to the second electrode of the selection transistor TP1, a first electrode coupled to a power source line PS and a second electrode. The emissive element EM, such as an OLED, may be coupled to the second electrode of the driving transistor TP3 and emit light according to a current drawn from the driving transistor TP3. The capacitor C1 may comprise a first terminal coupled to the control electrode of the driving transistor TP3 and a second terminal coupled to an emission signal line Em_Line. The reference transistor TP5 may comprise a control electrode coupled to a first voltage source VS1 providing a voltage with a first predetermined level, a first electrode and a second electrode. The second electrode of the reference transistor TP5 is coupled to the control electrode of the driving transistor TP3. The capacitor C2 may comprise a first terminal coupled to a second voltage source VS2 providing a voltage with a second predetermined level and a second terminal coupled to the first electrode of the reference transistor TP5.

There may be N*M such pixel circuits, as per the pixel circuit 100 shown in FIG. 1, arranged in a matrix in display device to form a pixel array, where n, m, N and M are positive integers and $0 \leq n \leq N$, $0 \leq m \leq M$.

Figure 2:
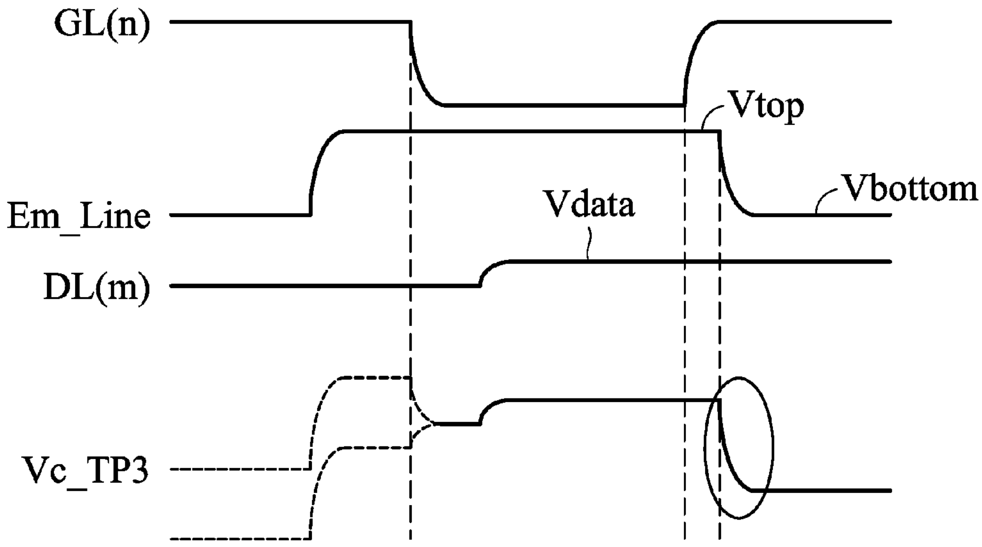
FIG. 2 is an exemplary diagram showing the signal waveforms according to an embodiment of the invention.

FIG. 2 is an exemplary diagram showing the signal waveforms according to an embodiment of the invention. As shown in FIG. 2, when a selection signal pulse on the gate line GL(n) arrives (e.g. a falling edge of the pulse on the gate line GL(n) as shown), the selection transistor TP1 is turned on, and a data voltage on the data line DL(m) is transmitted to the control electrode of the driving transistor TP3.

When the selection signal pulse on the gate line GL(n) ends (e.g. after a rising edge of the pulse on the gate line GL(n) as shown), the selection transistor TP1 is turned off, and the capacitor C1 can hold the data voltage on the control electrode of the driving transistor TP3 after the selection transistor TP1 is turned off.

According to an embodiment of the invention, the first predetermined level may be set to 0V, and the second predetermined level may be set to 0V. Therefore, in an embodiment of the invention, the first voltage source VS1 and the second voltage source VS2 may be connected to the power source line PS, which in this embodiment may be designed to provide a voltage at approximately 0V.

The data line receives a data voltage Vdata. This data voltage Vdata may correspond to the video signal for display at a corresponding pixel, and represent, for example, a range from a white level to a black level in the voltage range of approximately 3V to 4V. The data voltage Vdata is applied to the second electrode of the reference transistor TP5 and the control electrode of the driving transistor TP3 when the selection transistor TP1 is turned on. A pulse or a voltage rising may be generated on the emission signal line Em_Line to set a voltage on the emission signal line Em_Line to a top voltage Vtop. According to an embodiment of the invention, the top voltage Vtop may be set at approximately +6V. At this timing, the reference transistor TP5 is turned on and the driving transistor TP3 is turned off.

After the selection transistor TP1 is turned off, the voltage on the emission signal line Em_Line may be reduced to, for example, −3V, to induce a voltage change or a voltage transition (that is, a voltage drop from a high level to a low level in this example) on the emission signal line Em_Line. In response to the voltage change or voltage transition on the emission signal line Em_Line, a voltage Vc_TP3 at the control electrode of the driving transistor TP3 is changed as well (as the portion marked with a circle in FIG. 2). For example, the voltage Vc_TP3 is lowered by approximately 7V, and then the driving transistor TP3 is turned on to provide the current to the emissive element EM.

This operation is performed sequentially and repeatedly in the matrix, and then an image can be displayed (Note that the dotted lines in the beginning of the voltage Vc_TP3 represents the signal waveforms in a previous frame, which may be a high-state or a low-state signal).

Since the voltage on the emission signal line Em_Line is decreased from approximately +6V to −3V, the voltage at the second electrode of the reference transistor TP5 decreases from approximate 3V~4V to approximate 0 V~(−3V), and the reference transistor TP5 changes from an ON-state to an OFF-state (that is, it changes from being turned on to being turned off). In addition, the voltage at the first electrode of the reference transistor TP5 decreases from approximate 3V~4V to the voltage of switch point from ON-state to OFF-state of the reference transistor TP5.

Figure 3:
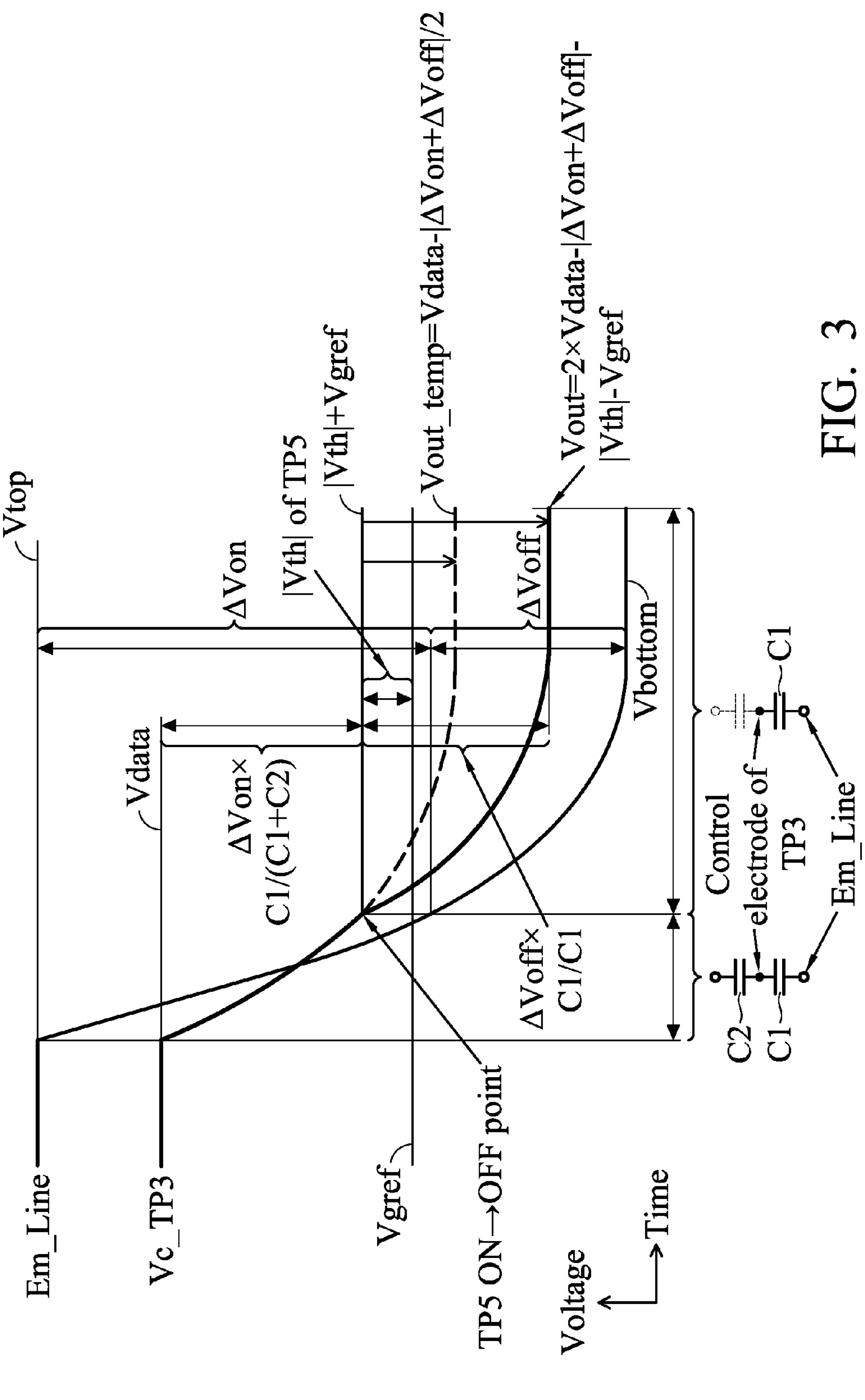
FIG. 3 shows an enlarged chart of the portion marked with a circle in FIG. 2.

FIG. 3 shows an enlarged chart of the portion marked with a circle in FIG. 2. When the voltage on the emission signal line Em_Line begins to drop, the voltage Vc_TP3 at the control electrode of the driving transistor TP3 drops as well. When the voltage Vc_TP3 at the control electrode of the driving transistor TP3 drops to a predetermined switch-point voltage (shown as the TP5 ON→OFF point in FIG. 3), the reference transistor TP5 is turned off (since the Vgs voltage becomes insufficient to turn on the reference transistor TP5). Therefore, in the embodiment of the invention, the reference transistor TP5 is switched from being turned on to being turned off during the voltage change or voltage transition.

Viewing from the control electrode of the driving transistor TP3, the connected capacitance value is changed from C1+C2 (the capacitance of the capacitor C1+ the capacitance of the capacitor C2) to C1 as the reference transistor TP5 is switched from ON to OFF. The timing of this capacitance change is related with the |Vth| value of the reference transistor TP5.

Suppose that, in an embodiment of the invention, the capacitor C1 and the capacitor C2 have an equivalent capacitance. After the voltage Vc_TP3 at the control electrode of the driving transistor TP3 has passed |Vth| level (where |Vth| is the threshold voltage of the reference transistor TP5), the descending ratio in the ΔVoff term becomes 2 times the level of the ΔVon term because there is no distribution of the capacitance C2, where ΔVon represents the voltage difference, between the top voltage Vtop and the switch-point voltage where the reference transistor TP5 is switched from ON to OFF, of the signal on the emission signal line Em_Line and ΔVoff represents the voltage difference, between the switch-point voltage and the bottom voltage Vbottom, of the signal on the emission signal line Em_Line.

The resulting voltage Vout at the control electrode of the driving transistor TP3 is derived as indicated below.

In FIG. 3, the dotted line is a temporary waveform of the voltage at the control electrode of the driving transistor TP3 if the reference transistor TP5 is maintained in an ON state (that is, not switched to an OFF state).

In this case, the resulting voltage Vout_temp at the control electrode of the driving transistor TP3 (when the reference transistor TP5 is kept on) drops by an amount of |Δ Von+Δ Voff|*[C1/(C1+C2)] from the Vdata level. Note that when C1=C2, C1/(C1+C2)=½ can be obtained. Therefore, $$V\text{out\_temp}=V\text{data}-|\Delta V\text{on}+\Delta V\text{off}|/2 \qquad \text{Eq.(1)}$$

can be obtained.

Note that when the reference transistor TP5 is kept on, the |Vth| term is not included in the resulting voltage Vout_temp. In this manner, the overall operation cannot compensate for the threshold voltage variation.

On the other hand, according to the embodiment of the invention, the reference transistor TP5 is turned off at the switch point as shown in FIG. 3. After crossing a baseline level: |Vth|+Vgref as shown in FIG. 3, the voltage Vc_TP3 at the control electrode of the driving transistor TP3 drops 2 times the value of the temporary voltage (the dotted line in FIG. 3), where |Vth| is the threshold voltage of the reference transistor TP5 and Vgref is the voltage of the voltage source VS1 provided to the control electrode of the reference transistor TP5.

Therefore, the resulting voltage Vout can be obtained as:

$$\begin{aligned} Vout &= (|Vth| + Vgref) - 2*((|Vth| + Vgref) - \text{Vout\_temp}) \\ &= (|Vth| + Vgref) - 2*((|Vth| + Vgref) - (Vdata - |\Delta Von + \Delta Voff|/2)) \\ &= 2*Vdata - |\Delta Von + \Delta Voff| - (|Vth| + Vgref) \end{aligned} \qquad \text{Eq. (2)}$$

Note that the |Vth| term is included in the resulting voltage Vout to compensate for the threshold voltage variation. In cases where the transistors in one pixel circuit have the same threshold voltage, the threshold voltage variation can be compensated for by including the threshold voltage |Vth| of the reference transistor TP5 in the resulting voltage Vout at the control electrode of the driving transistor TP3. Therefore, the voltages Vc_TP3 at the control electrode of the driving transistor TP3 will not be affected by the threshold voltage variation, and thus the current generated to drive the emissive element EM can be kept the same regardless of how the threshold voltage Vth varies.

Figure 4A:
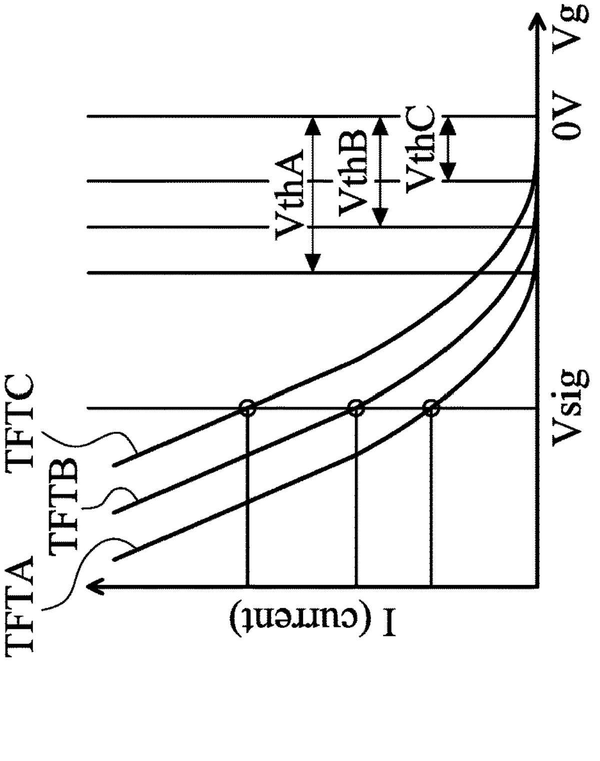
FIG. 4A shows the current-voltage curve of the driving transistor in the conventional design without threshold voltage compensation.

FIG. 4A shows the current-voltage curve of the driving transistor in the conventional design without making a threshold voltage compensation, where the voltage Vg represents the driving voltage provided at the control electrode of the driving transistor in the conventional design and I represents the driving current generated by the driving transistor. Suppose there are three transistors TFTA, TFTB and TFTC with different threshold voltages VthA, VthB and VthC. Defining the voltage Vsig=2*Vdata−|Δ Von+ΔVoff|−Vgref, it can be seen from FIG. 4A that under the same driving voltage Vsig, the three transistors output different driving current to drive the emissive element EM because of different threshold voltages, causing the non-uniform image display problem.

Figure 4B:
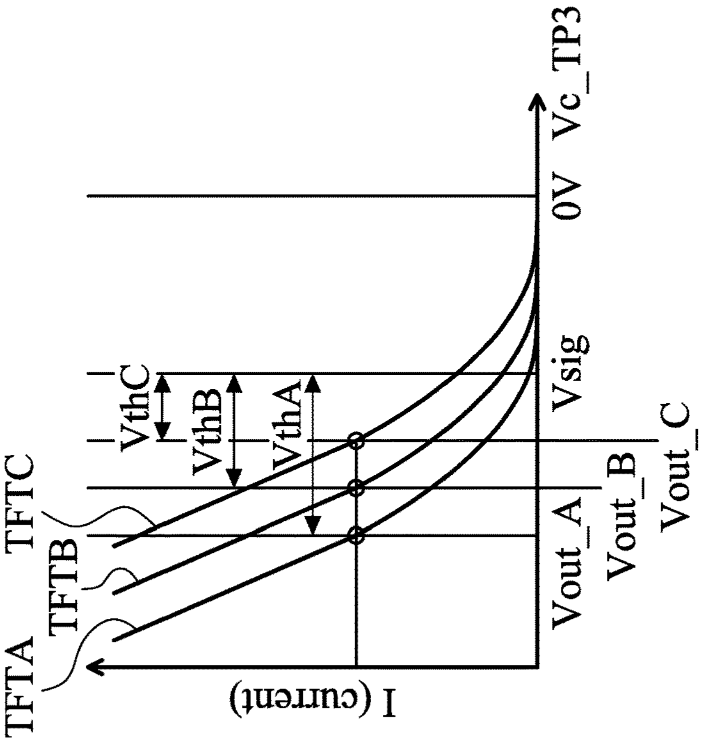
FIG. 4B shows an exemplary current-voltage curve of the driving transistor with threshold voltage compensation according to an embodiment of the invention.

FIG. 4B shows an exemplary current-voltage curve of the driving transistor with threshold voltage compensation according to an embodiment of the invention, where the voltage Vc_TP3 represents the driving voltage provided at the control electrode of the driving transistor TP3 and I represents the driving current generated by the driving transistor TP3. It can be seen from FIG. 4B that because the resulting voltage Vout at the control electrode of the driving transistor TP3 is compensating for the threshold voltage variation by including the threshold voltage |Vth| as below:

$$Vout\_A=Vsig-|VthA| \quad \text{Eq.(3)}$$

$$Vout\_B=Vsig-|VthB| \quad \text{Eq.(4)}$$

$$Vout\_C=Vsig-|VthC| \quad \text{Eq.(5)}$$

In this manner, uniform current/luminance on display can be obtained.

Note that, based on the concept of the invention, even when the threshold voltages are different in different pixel circuits (that is, different pixels in the pixel array), the currents generated to drive the emissive elements in different pixel circuits can be kept the same and the uniformity of the image in the whole display area can be maintained. In this manner, the non-uniform image problem caused by the threshold voltage variation among different pixels in the conventional design can also be solved.

Figure 5:
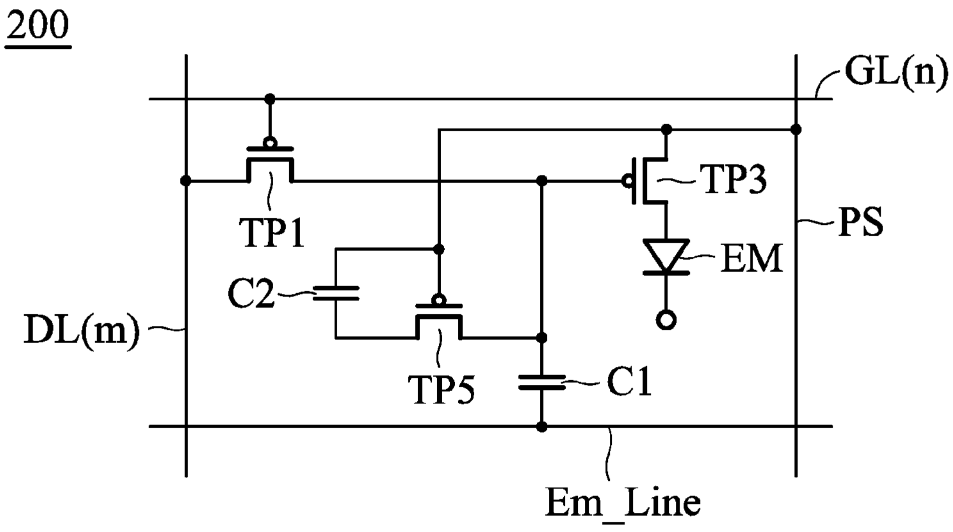
FIG. 5 is an exemplary circuit diagram of a pixel circuit according to a second embodiment of the invention.

FIG. 5 is an exemplary circuit diagram of a pixel circuit according to a second embodiment of the invention. The pixel circuit 200 shown in FIG. 5 is similar to the pixel circuit 100 shown in FIG. 1, but they are different in that the control electrode of the reference transistor TP5 and the first terminal of the capacitor C2 are coupled to the power source line PS. According to an embodiment of the invention, one or both of the first voltage source and the second voltage source may be coupled to the power source line PS.

Figure 6:
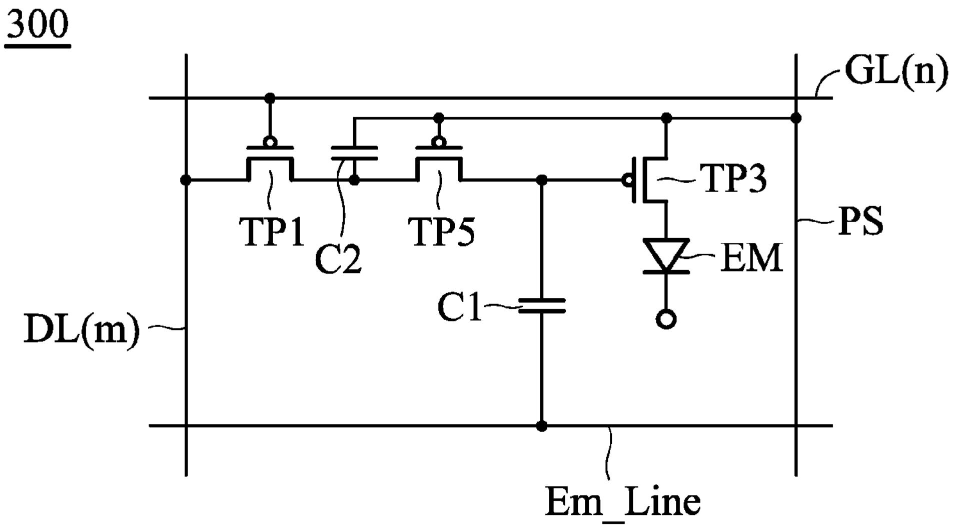
FIG. 6 is an exemplary circuit diagram of a pixel circuit according to a third embodiment of the invention.

FIG. 6 is an exemplary circuit diagram of a pixel circuit according to a third embodiment of the invention. The pixel circuit 300 shown in FIG. 6 is similar to the pixel circuit 200 shown in FIG. 5, the difference being that the reference transistor TP5 is coupled between the selection transistor TP1 and the driving transistor TP3.

Figure 7:
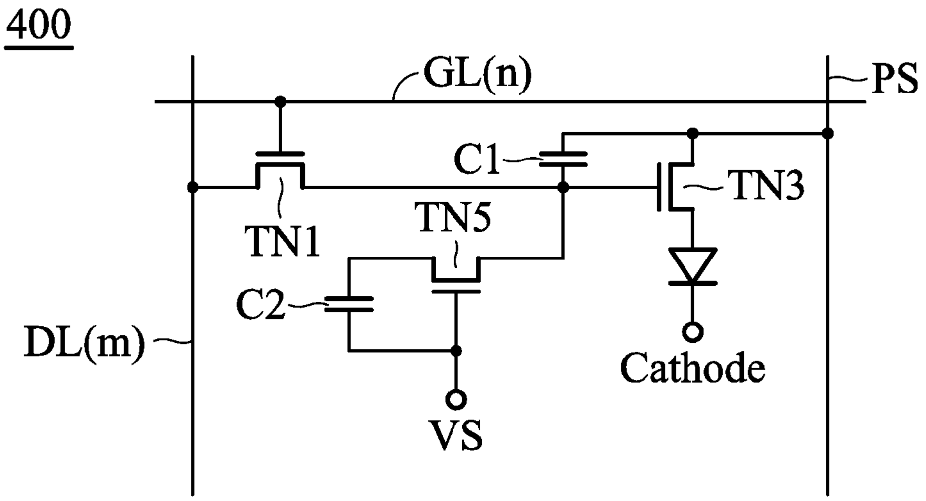
FIG. 7 is an exemplary circuit diagram of a pixel circuit according to a fourth embodiment of the invention.

FIG. 7 is an exemplary circuit diagram of a pixel circuit according to a fourth embodiment of the invention. In the fourth embodiment of the invention, the selection transistor TN1, the driving transistor TN3 and the reference transistor TN5 are N-type transistors and the emission signal line as shown in FIG. 1 may be connected to or replaced by the power source line PS (therefore, represented by the power source line PS). In this manner, the power source line PS is used for controlling the ON-OFF state of the driving transistor TN3 and also as the function of the emission signal line. In addition, in this embodiment, the voltage source VS may be not connected to the power source line PS, and the voltage provided by the voltage source VS may be set higher than the data voltage.

Figure 8:
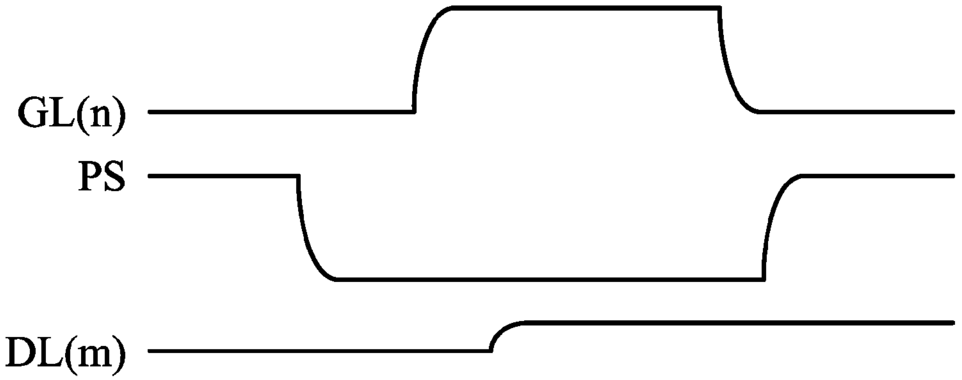
FIG. 8 is an exemplary diagram showing the signal waveforms of the pixel circuit according to the fourth embodiment of the invention.

FIG. 8 is an exemplary diagram showing the signal waveforms for the pixel circuit 400 shown in FIG. 7 according to an embodiment of the invention. When the selection transistor TN1, the driving transistor TN3 and the reference transistor TN5 are N-type transistors, the voltage on the power source line PS is not a constant voltage but the pulse voltage. The selection signal pulse on the gate line GL(n) becomes an active high pulse to turn on the selection transistor TN1. After the selection transistor TN1 is turned off, the voltage on the power source line PS is changed or transited from a low level to a high level. The remaining operations of the pixel circuit 400 are similar to those of the pixel circuit 100, and are omitted here for brevity.

Figure 9:
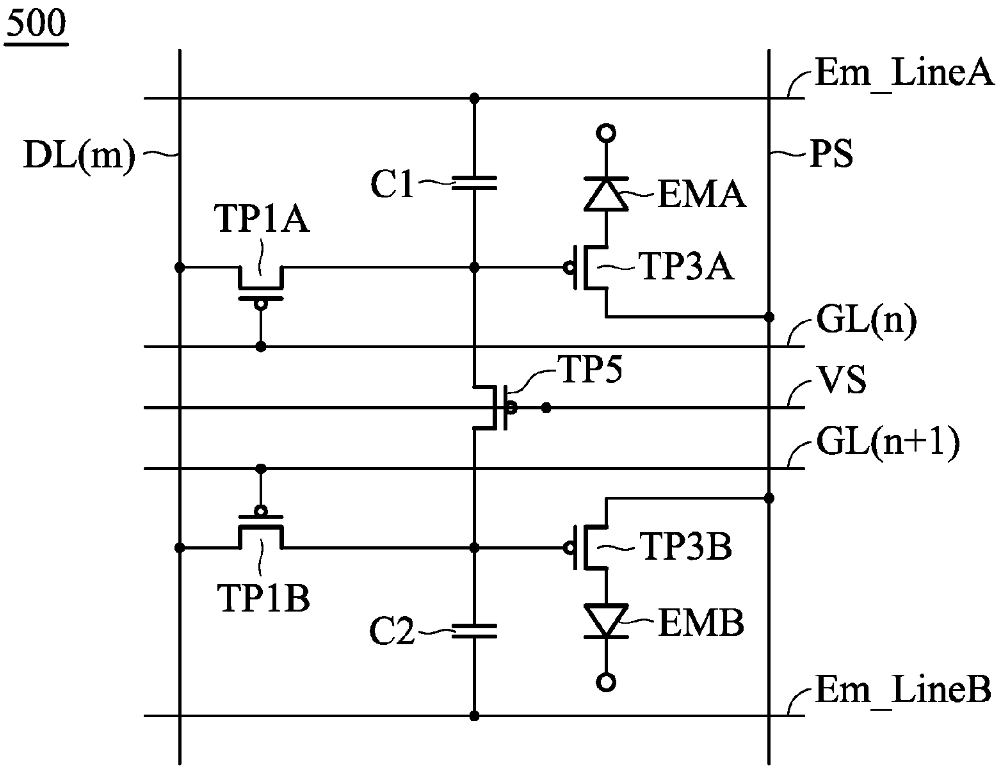
FIG. 9 is an exemplary circuit diagram of a pixel circuit according to a fifth embodiment of the invention.

FIG. 9 is an exemplary circuit diagram of a pixel circuit according to a fifth embodiment of the invention. In the fifth embodiment, the pixel array may comprise multiple pairs of pixel units. For example, a pair of pixel units is shown in FIG. 9. The pixel circuit 500 may comprise a first pixel unit and a second pixel unit. The first pixel unit may comprise a selection transistor TP1A, a driving transistor TP3A and an emissive element EMA. The second pixel unit may comprise a selection transistor TP1B, a driving transistor TP3B and an emissive element EMB. In the fifth embodiment, the reference transistor TP5 and capacitors C1 and C2 are shared by the two pixel units disposed adjacent to each other in the direction along the data line.

The selection transistor TP1A may comprise a control electrode coupled to the gate line GL(n) for receiving a selection signal, a first electrode coupled to the data line DL(m) and a second electrode. The driving transistor TP3A may comprise a control electrode coupled to the second electrode of the selection transistor TP1A, a first electrode coupled to the power source line PS and a second electrode. The emissive element EMA may be coupled to the second electrode of the driving transistor TP3A and emit light according to a current drawn from the driving transistor TP3A.

The selection transistor TP1B may comprise a control electrode coupled to the gate line GL(n+1) for receiving a selection signal, a first electrode coupled to the data line DL(m) and a second electrode. The driving transistor TP3B may comprise a control electrode coupled to the second electrode of the selection transistor TP1B, a first electrode coupled to the power source line PS and a second electrode. The emissive element EMB may be coupled to the second electrode of the driving transistor TP3B and emit light according to a current drawn from the driving transistor TP3B.

The reference transistor TP5 may comprise a control electrode coupled to a voltage source VS providing voltage at a predetermined level, a first electrode coupled to the control electrode of the driving transistor TP3A and a second electrode coupled to the control electrode of the driving transistor TP3B. The capacitor C1 may comprise a first terminal coupled to the control electrode of the driving transistor TP3A and a second terminal coupled to the emission signal line Em_LineA. The capacitor C2 may comprise a first terminal coupled to the control electrode of the driving transistor TP3B and a second terminal coupled to the emission signal line Em_LineB.

The voltage provided by the voltage source VS may be set to a constant voltage, e.g. 0V. The voltage provided by the power source line PS may also be set to a constant voltage, e.g. 0V. These supply lines are preferably separated on the pixel array for deducing the influence of the IR drop problem.

Figure 10:
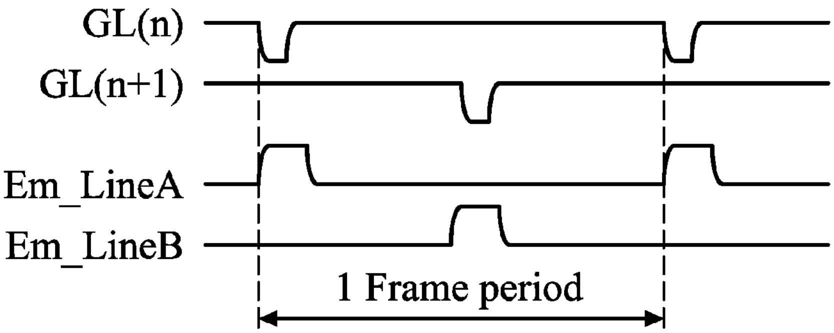
FIG. 10 is an exemplary diagram showing the signal waveforms of the pixel circuit according to the fifth embodiment of the invention.

FIG. 10 is an exemplary diagram showing the signal waveforms for the pixel circuit 500 shown in FIG. 9 according to the fifth embodiment of the invention. In the fifth embodiment of the invention, the emissive element EMA emits light in a half period of a frame, and the emissive element EMB emits light in the other half period of the frame. Therefore, the gate line GL(n) provides a selection pulse and the emission signal line Em_LineA provides an emission pulse in the former half period of a frame, and the gate line GL(n+1) provides a selection pulse and the emission signal line Em_LineB provides an emission pulse in the latter half period of the frame.

Operations of the pixel circuit 500 shown in FIG. 9 are similar to those of the pixel circuit 100 shown in FIG. 1. A data voltage on the data line DL(m) is applied to the reference transistor TP5 when the selection transistor TP1A or TP1B is turned on, and the data voltage is stored in the capacitor C1 and the capacitor C2 when the reference transistor TP5 is turned on. The operation of the selection transistor TP1A or TP1B writing the data voltage leads both of the driving transistors TP3A and TP3B turning off.

When the selection transistor TP1A or TP1B is turned off in response to the selection signal on the corresponding gate line, a change or transition in a voltage is induced on the emission signal line Em_LineA or Em_LineB, and the reference transistor TP5 is switched from being turned on to being turned off during the voltage change (or, voltage transition).

In response to the voltage change (or, voltage transition) on the emission signal line Em_LineA or Em_LineB, the voltage at the control electrode of the driving transistor TP3A or TP3B is changed and then the driving transistor TP3A or TP3B is turned on to provide the current to the corresponding emissive element EMA or EMB. Here, the capacitors C1 and C2 preferably have an equivalent capacitance.

Figure 11:
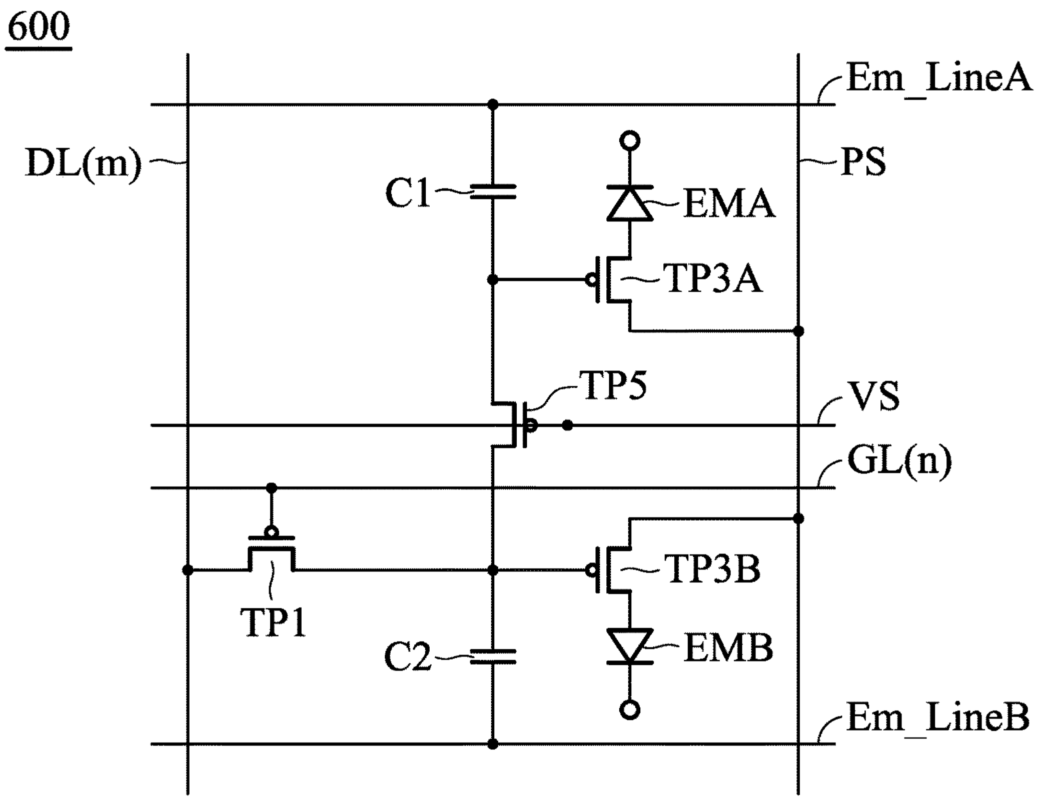
FIG. 11 is an exemplary circuit diagram of a pixel circuit according to a sixth embodiment of the invention.

FIG. 11 is an exemplary circuit diagram of a pixel circuit according to a sixth embodiment of the invention. In the sixth embodiment, the pixel array may comprise multiple pairs of pixel units. For example, a pair of pixel units is shown in FIG. 11. The pixel circuit 600 may comprise a first pixel unit and a second pixel unit. The first pixel unit may comprise a driving transistor TP3A and an emissive element EMA. The second pixel unit may comprise a driving transistor TP3B and an emissive element EMB. In the sixth embodiment, the selection transistor TP1, the reference transistor TP5 and capacitors C1 and C2 are shared by the two pixel units disposed adjacent to each other in the direction along the data line. In addition, the two pixel units further share the same gate line and data line.

The driving transistor TP3A may comprise a control electrode, a first electrode coupled to the power source line PS and a second electrode. The emissive element EMA may be coupled to the second electrode of the driving transistor TP3A and emit light according to a current drawn from the driving transistor TP3A. The driving transistor TP3B may comprise a control electrode, a first electrode coupled to the power source line PS and a second electrode. The emissive element EMB may be coupled to the second electrode of the driving transistor TP3B and emit light according to a current drawn from the driving transistor TP3B.

The selection transistor TP1 may comprise a control electrode coupled to the gate line GL(n) for receiving a selection signal, a first electrode coupled to the data line DL(m) and a second electrode coupled to the control electrode of the driving transistor TP3A (through the reference transistor TP5) and the control electrode of the driving transistor TP3B. The reference transistor TP5 may comprise a control electrode coupled to the voltage source VS providing voltage at a predetermined level, a first electrode coupled to the control electrode of the driving transistor TP3A and a second electrode coupled to the control electrode of the driving transistor TP3B.

The capacitor C1 may comprise a first terminal coupled to the control electrode of the driving transistor TP3A and a second terminal coupled to an emission signal line Em_LineA. The capacitor C2 may comprise a first terminal coupled to the control electrode of the driving transistor TP3B and a second terminal coupled to an emission signal line Em_LineB.

Figure 12:
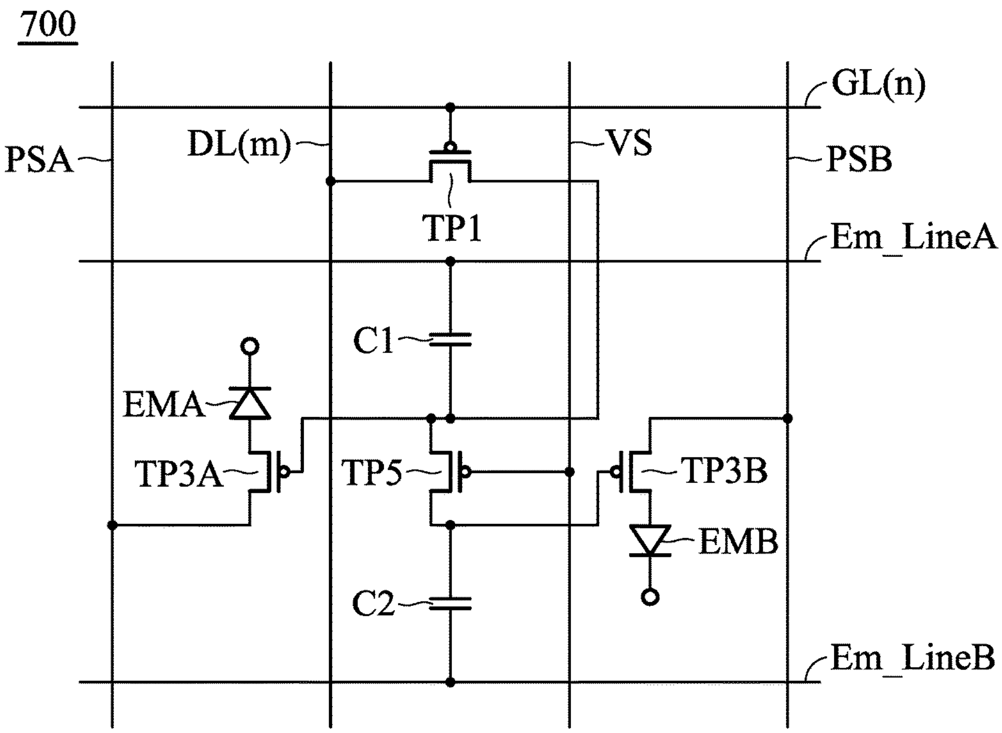
FIG. 12 is an exemplary circuit diagram of a pixel circuit according to a seventh embodiment of the invention.

FIG. 12 is an exemplary circuit diagram of a pixel circuit according to a seventh embodiment of the invention. In the seventh embodiment, the pixel array may comprise multiple pairs of pixel units. For example, a pair of pixel units is shown in FIG. 12. The pixel circuit 700 may comprise a first pixel unit and a second pixel unit. The first pixel unit may comprise a driving transistor TP3A and an emissive element EMA. The second pixel unit may comprise a driving transistor TP3B and an emissive element EMB. In the seventh embodiment, the selection transistor TP1, the reference transistor TP5 and capacitors C1 and C2 are shared by the two pixel units disposed adjacent to each other in the direction along the gate line. In addition, the two pixel units further share the same gate line and data line.

The driving transistor TP3A may comprise a control electrode, a first electrode coupled to the power source line PSA and a second electrode. The emissive element EMA may be coupled to the second electrode of the driving transistor TP3A and emit light according to a current drawn from the driving transistor TP3A. The driving transistor TP3B may comprise a control electrode, a first electrode coupled to the power source line PSB and a second electrode. The emissive element EMB may be coupled to the second electrode of the driving transistor TP3B and emit light according to a current drawn from the driving transistor TP3B.

The selection transistor TP1 may comprise a control electrode coupled to the gate line GL(n) for receiving a selection signal, a first electrode coupled to the data line DL(m) and a second electrode coupled to the control electrode of the driving transistor TP3A and the control electrode of the driving transistor TP3B (through the reference transistor TP5). The reference transistor TP5 may comprise a control electrode coupled to the voltage source VS providing voltage at a predetermined level, a first electrode coupled to the control electrode of the driving transistor TP3A and a second electrode coupled to the control electrode of the driving transistor TP3B.

The capacitor C1 may comprise a first terminal coupled to the control electrode of the driving transistor TP3A and a second terminal coupled to an emission signal line Em_LineA. The capacitor C2 may comprise a first terminal coupled to the control electrode of the driving transistor TP3B and a second terminal coupled to an emission signal line Em_LineB.

Figure 13:
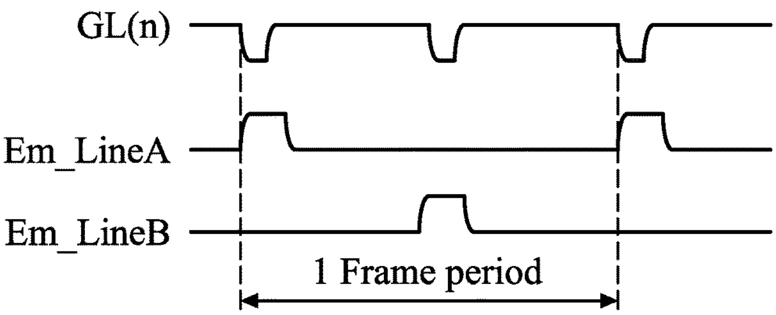
FIG. 13 is an exemplary diagram showing the signal waveforms for the pixel circuit with two pixel units sharing the same gate line according to an embodiment of the invention.

FIG. 13 is an exemplary diagram showing the signal waveforms for the pixel circuit with two pixel units sharing the same gate line, as shown in FIG. 11 and FIG. 12, according to an embodiment of the invention. In cases where two pixel units share the same gate line, the emissive element EMA emits light in a half period of a frame, and the emissive element EMB emits light in the other half period of the frame. Therefore, the gate line GL(n) provides a selection pulse and the emission signal line Em_LineA provides an emission pulse in the former half period of a frame, and the gate line GL(n) provides another selection pulse and the emission signal line Em_LineB provides an emission pulse in the later half period of the frame.

Operations of the pixel circuits 600 and 700 shown in FIG. 11 and FIG. 12 are similar to those shown in FIG. 9. A data voltage on the data line DL(m) is applied to the reference transistor TP5 when the selection transistor TP1 is turned on, and the data voltage is stored in the capacitor C1 and the capacitor C2 when the reference transistor TP5 is turned on.

When the selection transistor TP1 is turned off, a change or transition in a voltage is induced on the emission signal line Em_LineA or Em_LineB, and the reference transistor TP5 is switched from being turned on to being turned off during the voltage change or transition.

In response to the voltage change or transition on the emission signal line Em_LineA or Em_LineB, a voltage at the control electrode of the driving transistor TP3A or TP3B is changed and then the driving transistor TP3A or TP3B is turned on to provide the current to the corresponding emissive element EMA or EMB. Here, the capacitors C1 and C2 preferably have an equivalent capacitance.

Based on the concept described above, because the resulting voltage Vout at the control electrode of the driving transistor compensates for the threshold voltage variation by including the threshold voltage |Vth|, the current generated to drive the emissive element can be kept the same regardless of how the threshold voltage Vth varies. The compensation mechanism works even when the amount of threshold voltage variation is different in different pixel circuits. In this manner, uniform current/luminance on display can be obtained.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

While the invention has been described by way of example and in terms of preferred embodiment, it is to be understood that the invention is not limited thereto. Those who are skilled in this technology can still make various alterations and modifications without departing from the scope and spirit of this invention. Therefore, the scope of the present invention shall be defined and protected by the following claims and their equivalents.

What is claimed is:

1. A pixel circuit, comprising:

a selection transistor, comprising a control electrode, a first electrode and a second electrode, wherein the control electrode is coupled to a gate line for receiving a selection signal and the first electrode is coupled to a data line;

a driving transistor, comprising a control electrode, a first electrode and a second electrode, wherein the control electrode is coupled to the second electrode of the selection transistor and the first electrode is coupled to a power source line;

an emissive element, coupled to the second electrode of the driving transistor and emitting light according to a current drawn from the driving transistor;

a first capacitor, comprising a first terminal coupled to the control electrode of the driving transistor and a second terminal coupled to an emission signal line;

a reference transistor, comprising a control electrode coupled to a first voltage source providing a voltage with a first predetermined level, a first electrode and a second electrode, wherein the second electrode of the reference transistor is coupled to the control electrode of the driving transistor; and a second capacitor, comprising a first terminal coupled to a second voltage source providing a voltage with a second predetermined level and a second terminal coupled to the first electrode of the reference transistor.

2. The pixel circuit as claimed in claim 1, wherein a data voltage on the data line is applied to the reference transistor when the selection transistor is turned on, and the data voltage is stored in the first capacitor and the second capacitor when the reference transistor is turned on.

3. The pixel circuit as claimed in claim 1, wherein when the selection transistor is turned off, a change in a voltage is induced on the emission signal line, and the reference transistor is switched from being turned on to being turned off during the voltage change.

4. The pixel circuit as claimed in claim 3, wherein in response to the voltage change on the emission signal line, a voltage at the control electrode of the driving transistor is changed and then the driving transistor is turned on to provide the current to the emissive element.

5. The pixel circuit as claimed in claim 3, wherein the driving transistor and the reference transistor are P-type transistors, and after the selection transistor is turned off, the voltage on the emission signal line is changed from a high level to a low level.

6. The pixel circuit as claimed in claim 3, wherein the driving transistor and the reference transistor are N-type transistors, and after the selection transistor is turned off, the voltage on the emission signal line is changed from a low level to a high level.

7. The pixel circuit as claimed in claim 1, wherein the first capacitor and the second capacitor have an equivalent capacitance.

8. The pixel circuit as claimed in claim 1, wherein one or both of the first voltage source and the second voltage source is/are coupled to the power source line.

9. A pixel circuit, comprising:

a pair of pixel units, comprising a first pixel unit and a second pixel unit, wherein the first pixel unit comprises:

a first selection transistor, comprising a control electrode, a first electrode and a second electrode, wherein the control electrode is coupled to a first gate line for receiving a first selection signal, the first electrode is coupled to a data line;

a first driving transistor, comprising a control electrode, a first electrode and a second electrode, wherein the control electrode is coupled to the second electrode of the first selection transistor, the first electrode is coupled to a power source line; and a first emissive element, coupled to the second electrode of the first driving transistor and emitting light according to a current drawn from the first driving transistor, and wherein the second pixel unit comprises:

a second selection transistor, comprising a control electrode, a first electrode and a second electrode, wherein the control electrode is coupled to a second gate line for receiving a second selection signal, the first electrode is coupled to the data line;

a second driving transistor, comprising a control electrode, a first electrode and a second electrode, wherein the control electrode is coupled to the second electrode of the second selection transistor, the first electrode is coupled to the power source line; and a second emissive element, coupled to the second electrode of the second driving transistor and emitting light according to a current drawn from the second driving transistor;

a reference transistor, comprising a control electrode coupled to a voltage source providing voltage at a predetermined level, a first electrode coupled to the control electrode of the first driving transistor and a second electrode coupled to the control electrode of the second driving transistor;

a first capacitor, comprising a first terminal coupled to the control electrode of the first driving transistor and a second terminal coupled to a first emission signal line; and a second capacitor, comprising a first terminal coupled to the control electrode of the second driving transistor and a second terminal coupled to a second emission signal line.

10. The pixel circuit as claimed in claim 9, wherein the first emissive element emits light in a half period of a frame, and the second emissive element emits light in the other half period of the frame.

11. The pixel circuit as claimed in claim 9, wherein a data voltage on the data line is applied to the reference transistor when the first/second selection transistor is turned on, and the data voltage is stored in the first capacitor and the second capacitor when the reference transistor is turned on.

12. The pixel circuit as claimed in claim 9, wherein when the first/second selection transistor is turned off, a change in a voltage is induced on the first/second emission signal line, and the reference transistor is switched from being turned on to being turned off during the voltage change.

13. The pixel circuit as claimed in claim 12, wherein in response to the voltage change on the first/second emission signal line, a voltage at the control electrode of the first/second driving transistor is changed and then the first/second driving transistor is turned on to provide the current to the first/second emissive element.

14. The pixel circuit as claimed in claim 9, wherein the first capacitor and the second capacitor have an equivalent capacitance.

15. A pixel circuit, comprising:

a pair of pixel units, comprising a first pixel unit and a second pixel unit, wherein the first pixel unit comprises:

a first driving transistor, comprising a control electrode, a first electrode coupled to a first power source line, and a second electrode; and a first emissive element, coupled to the second electrode of the first driving transistor and emitting light according to a current drawn from the first driving transistor, and wherein the second pixel unit comprises:

a second driving transistor, comprising a control electrode, a first electrode coupled to a second power source line, and a second electrode; and a second emissive element, coupled to the second electrode of the second driving transistor and emitting light according to a current drawn from the second driving transistor;

a selection transistor, comprising a control electrode coupled to a gate line for receiving a selection signal, a first electrode coupled to a data line and a second electrode coupled to the control electrode of the first driving transistor and the control electrode of the second driving transistor;

a reference transistor, comprising a control electrode coupled to a voltage source providing voltage at a predetermined level, a first electrode coupled to the control electrode of the first driving transistor and a second electrode coupled to the control electrode of the second driving transistor;

a first capacitor, comprising a first terminal coupled to the control electrode of the first driving transistor and a second terminal coupled to a first emission signal line; and a second capacitor, comprising a first terminal coupled to the control electrode of the second driving transistor and a second terminal coupled to a second emission signal line.

16. The pixel circuit as claimed in claim 15, wherein the first emissive element emits light in a half period of a frame, and the second emissive element emits light in the other half period of the frame.

17. The pixel circuit as claimed in claim 15, wherein a data voltage on the data line is applied to the reference transistor when the selection transistor is turned on, and the data voltage is stored in the first capacitor and the second capacitor when the reference transistor is turned on.

18. The pixel circuit as claimed in claim 15, wherein when the selection transistor is turned off, a change in a voltage is induced on the first/second emission signal line, and the reference transistor is switched from being turned on to being turned off during the voltage change.

19. The pixel circuit as claimed in claim 18, wherein in response to the voltage change on the first/second emission signal line, a voltage at the control electrode of the first/second driving transistor is changed and then the first/second driving transistor is turned on to provide the current to the first/second emissive element.

20. The pixel circuit as claimed in claim 15, wherein the first capacitor and the second capacitor have an equivalent capacitance.

* * * * *